United States Patent
Ogawa et al.

(10) Patent No.: US 9,698,301 B2
(45) Date of Patent: Jul. 4, 2017

(54) WAFER PROCESSING METHOD

(71) Applicant: DISCO CORPORATION, Tokyo (JP)

(72) Inventors: Yuki Ogawa, Tokyo (JP); Yohei Yamashita, Tokyo (JP); Tsubasa Obata, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/335,728

(22) Filed: Oct. 27, 2016

(65) Prior Publication Data

US 2017/0117434 A1 Apr. 27, 2017

(30) Foreign Application Priority Data

Oct. 27, 2015 (JP) .................................. 2015-210772

(51) Int. Cl.
| | |
|---|---|
| *H01L 21/00* | (2006.01) |
| *H01L 31/18* | (2006.01) |
| *H01L 21/683* | (2006.01) |
| *H01L 21/78* | (2006.01) |
| *H01L 21/268* | (2006.01) |
| *H01L 21/304* | (2006.01) |

(52) U.S. Cl.
CPC ...... *H01L 31/1876* (2013.01); *H01L 21/2686* (2013.01); *H01L 21/304* (2013.01); *H01L 21/6836* (2013.01); *H01L 21/78* (2013.01)

(58) Field of Classification Search
None
See application file for complete search history.

(56) References Cited

FOREIGN PATENT DOCUMENTS

JP  2005-064230  3/2005

*Primary Examiner* — Calvin Choi
(74) *Attorney, Agent, or Firm* — Greer Burns & Crain, Ltd.

(57) ABSTRACT

A wafer processing method for dividing a wafer (including a substrate and a functional layer formed on the front side of the substrate) along a plurality of division lines. The functional layer is partitioned by the division lines to define a plurality of regions. The method includes the following steps: attaching a protective member to the front side of the wafer; cutting the back side of the substrate of the wafer in an area corresponding to each division line with a cutting blade, thereby forming a division groove having a depth not reaching the functional layer so that a part of the substrate is left in this area; applying a laser beam to the wafer from the back side of the substrate along the bottom of each division groove extending along each division line to thereby cut the part of the substrate and the functional layer along each division line.

3 Claims, 10 Drawing Sheets

WAFER PROCESSING METHOD

BACKGROUND OF THE INVENTION

Field of the Invention

The present invention relates to a wafer processing method for dividing a wafer along a plurality of division lines formed on the front side of the wafer, the wafer being composed of a substrate and a functional layer formed on the front side of the substrate, the functional layer being partitioned by the division lines to define a plurality of separate regions where a plurality of image sensors as devices are individually formed.

Description of the Related Art

As well known in the art, in a semiconductor device fabrication process, a functional layer composed of an insulating film and a functional film is formed on the front side of a substrate such as a silicon substrate, and a plurality of devices such as integrated circuits (ICs) and large scale integrations (LSIs) are formed like a matrix from this functional layer, thus obtaining a semiconductor wafer having the plural devices. The functional layer is partitioned into the plural devices by a plurality of crossing division lines formed on the front side of the semiconductor wafer. The semiconductor wafer is divided along these division lines to obtain individual semiconductor device chips individually corresponding to the plural devices.

In recent years, a semiconductor wafer intended to improve the processing performance of semiconductor chips (devices) such as ICs and LSIs has been put into practical use. This semiconductor wafer is composed of a substrate such as a silicon substrate and a functional layer formed on the front side of the substrate, wherein the functional layer is composed of a low-permittivity insulator film (low-k film) and a functional film formed on the low-k film, the functional film forming a plurality of circuits. Thus, the semiconductor devices are formed from the functional layer. The low-k film is formed from an inorganic film of SiOF, BSG (SiOB), etc. or an organic film such as a polymer film of polyimide, parylene, etc.

Division of such a semiconductor wafer along the division lines is usually performed by using a cutting apparatus called a dicing saw. This cutting apparatus includes a chuck table for holding the semiconductor wafer as a workpiece, cutting means for cutting the semiconductor wafer held on the chuck table, and moving means for relatively moving the chuck table and the cutting means. The cutting means includes a spindle adapted to be rotated at high speeds and a cutting blade mounted on the spindle. The cutting blade is composed of a disk-shaped base and an annular cutting edge mounted on one side surface of the base along the outer circumference thereof. The annular cutting edge is an electroformed diamond blade formed by bonding diamond abrasive grains having a grain size of approximately 3 μm, for example.

However, the low-k film mentioned above is different in material from the substrate of the semiconductor wafer, so that it is difficult to cut the substrate together with the low-k film by using the cutting blade. That is, the low-k film is very brittle like mica. Accordingly, when the semiconductor wafer having the low-k film is cut along the division lines by using the cutting blade, there arises a problem such that the low-k film may be separated and this separation (delamination) may reach the devices (circuits) to cause fatal damage to the devices.

To solve this problem, Japanese Patent Laid-open No. 2005-64230 discloses a wafer dividing method including the steps of applying a laser beam along both sides of each division line on a semiconductor wafer to form two laser processed grooves along each division line, thereby dividing the functional layer (functional layer dividing step), and next positioning a cutting blade between the two laser processed grooves formed along each division line to relatively move the cutting blade and the semiconductor wafer, thereby cutting the semiconductor wafer along each division line. When the laser beam is applied to the front side of the wafer along each division line, debris may scatter from the wafer. To cope with this problem, the front side of the wafer is covered with a protective film formed of a water-soluble resin such as polyvinyl alcohol (PVA), before performing the functional layer dividing step mentioned above, thereby preventing the debris scattered from adhering directly to the devices.

SUMMARY OF THE INVENTION

However, in the case that the devices formed on the front side of the substrate such as a silicon substrate are image sensors such as complementary metal oxide semiconductors (CMOSs) and charge coupled devices (CCDs), relatively large debris scattered may penetrate through the protective film formed on the front side of the wafer, the protective film being formed of a water-soluble resin such as PVA. As a result, there is a problem such that delicate pixels constituting each image sensor may be damaged to cause a reduction in quality of each image sensor.

It is therefore an object of the present invention to provide a wafer processing method which can divide a wafer having plural image sensors formed on the front side of the substrate of the wafer, into individual device chips corresponding to the plural image sensors without a reduction in quality.

In accordance with an aspect of the present invention, there is provided a wafer processing method for dividing a wafer along a plurality of division lines formed on the front side of the wafer, the wafer being composed of a substrate and a functional layer formed on the front side of the substrate, the functional layer being partitioned by the division lines to define a plurality of separate regions where a plurality of image sensors are individually formed, the wafer processing method including a protective member attaching step of attaching a protective member to the front side of the wafer; a division groove forming step of cutting the back side of the substrate of the wafer in an area corresponding to each division line by using a cutting blade after performing the protective member attaching step, thereby forming a division groove having a depth not reaching the functional layer so that a part of the substrate is left in the area; and a wafer dividing step of applying a laser beam to the wafer from the back side of the substrate along the bottom of the division groove extending along each division line after performing the division groove forming step, thereby cutting the part of the substrate and the functional layer along each division line.

Preferably, the wafer processing method further includes a back grinding step of grinding the back side of the substrate of the wafer to thereby reduce the thickness of the wafer to a predetermined thickness after performing the protective member attaching step and before performing the division groove forming step.

Preferably, the wafer processing method further includes a wafer supporting step of attaching the back side of the wafer to an adhesive tape supported at its peripheral portion to an annular frame having an inside opening capable of receiving the wafer and next peeling the protective member from the front side of the wafer, after performing the wafer dividing step.

According to the wafer processing method of the present invention, in the wafer dividing step, the laser beam is applied to the wafer from the back side of the substrate along the bottom of each division groove to thereby cut the part of the substrate and the functional layer. Accordingly, even when relatively large debris scatters, there is no possibility that the debris may fall on the image sensors formed on the front side of the wafer, so that it is possible to solve the problem that the delicate pixels constituting each image sensor may be damaged to cause a reduction in quality of each image sensor.

Further, in the wafer dividing step of the wafer processing method according to the present invention, the laser beam is applied to cut the part of the substrate and the functional layer along each division groove formed in the division groove forming step. Accordingly, the thickness of a portion to be cut by the laser beam is small, e.g., 15 to 20 μm, so that the wafer can be completely cut by applying the laser beam.

Further, in the wafer dividing step, unlike the prior art, it is unnecessary to form two laser processed grooves along each division line and position a cutting blade within the spacing between the two laser processed grooves, so as to form each division groove. Accordingly, the width of each division line can be reduced according to the present invention, so that it is possible to increase the number of image sensors that can be formed per wafer, thereby improving the productivity.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
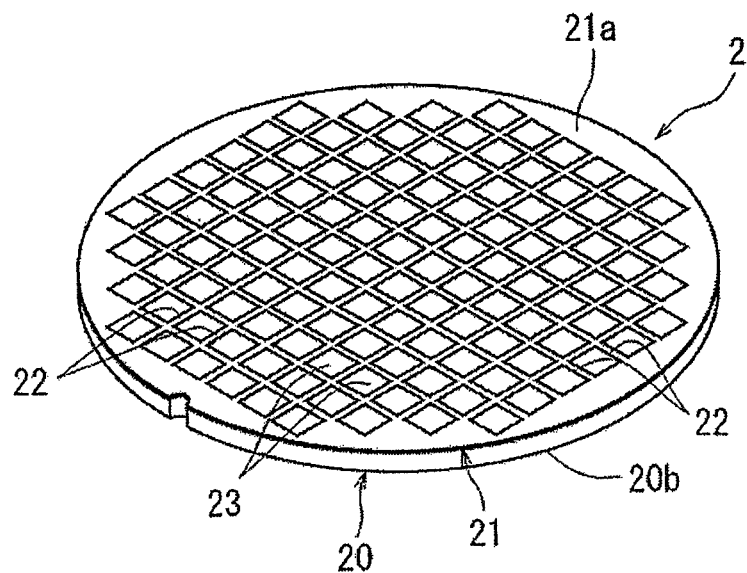
FIG. 1A is a perspective view of a semiconductor wafer.
Figure 1B:
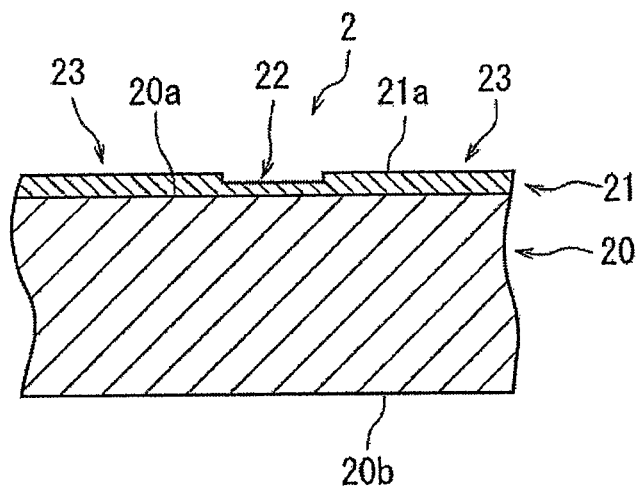
FIG. 1B is an enlarged sectional view of an essential part of the semiconductor wafer shown in FIG. 1A.

The wafer processing method according to the present invention will now be described in more detail with reference to the attached drawings. FIG. 1A is a perspective view of a semiconductor wafer 2 to be divided into individual image sensors by the wafer processing method according to the present invention, and FIG. 1B is an enlarged sectional view of an essential part of the semiconductor wafer 2 shown in FIG. 1A. As shown in FIGS. 1A and 1B, the semiconductor wafer 2 is composed of a substrate 20 such as a silicon substrate and a functional layer 21 formed on the front side 20a of the substrate 20. For example, the substrate 20 has a thickness of 600 μm. The functional layer 21 is composed of an insulating film and a functional film formed on the insulating film, the functional film forming a plurality of circuits. A plurality of crossing division lines 22 are formed on the front side 21a of the functional layer 21 to thereby define a plurality of separate regions where a plurality of image sensors 23 such as CMOSs and CCDs are individually formed. In this preferred embodiment, the functional layer 21 has a thickness of 10 μm, and the insulating film constituting the functional layer 21 is provided by an $SiO_2$ film or a low-permittivity insulator film (low-k film). Examples of the low-k film include an inorganic film of SiOF, BSG (SiOB), etc. and an organic film such as a polymer film of polyimide, parylene, etc. For example, the size of each image sensor 23 is set to 17 mm×13 mm.

Figure 2A:
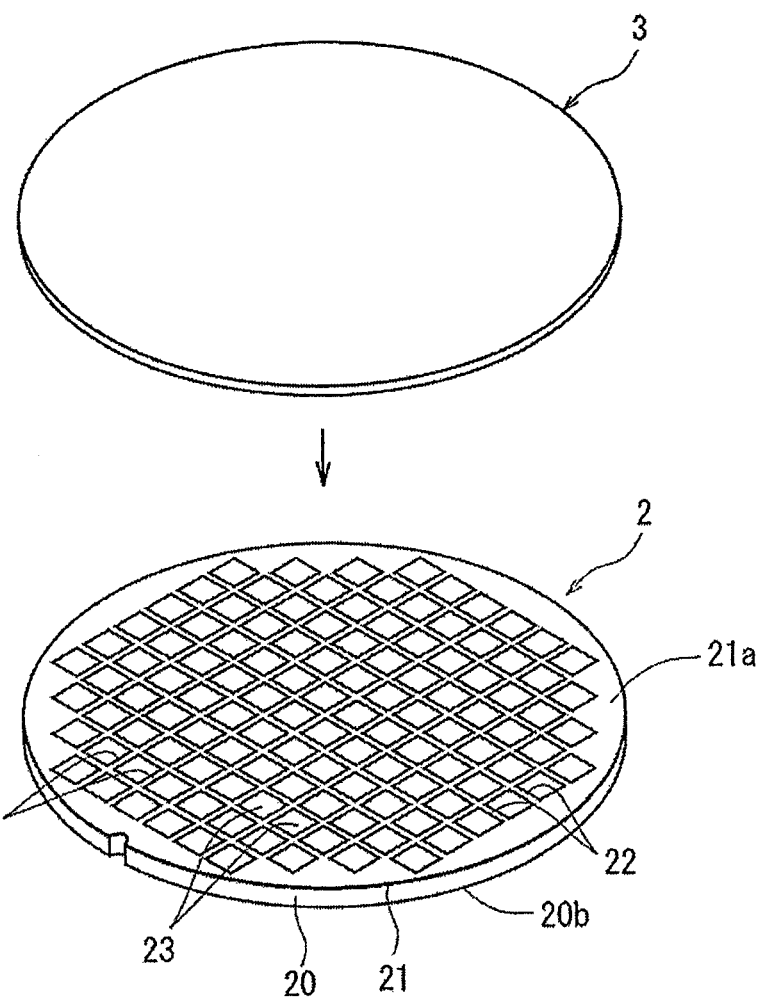
FIGS. 2A and 2B are perspective views for illustrating a protective member attaching step.
Figure 2B:
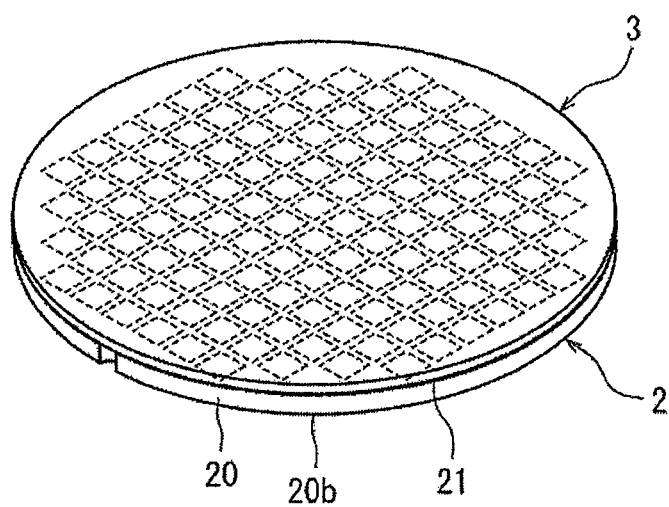

The wafer processing method for dividing the semiconductor wafer 2 along the division lines 22 will now be described. First, as shown in FIGS. 2A and 2B, a protective member 3 is attached to the front side 21a of the functional layer 21 formed on the substrate 20 of the semiconductor wafer 2, so as to protect the image sensors 23 (protective member attaching step). In this preferred embodiment, the protective member 3 is provided by a protective tape composed of a base sheet and an adhesive layer formed on the front side of the base sheet. For example, the base sheet is formed of polyvinyl chloride (PVC) and has a thickness of 100 μm, and the adhesive layer is formed of acrylic resin and has a thickness of approximately 5 μm. The protective member 3 may be formed from a hard plate having rigidity such as a glass substrate.

After performing the protective member attaching step mentioned above, a back grinding step is performed in such a manner that the back side 20b of the substrate 20 of the semiconductor wafer 2 is ground to reduce the thickness of the semiconductor wafer 2 to a predetermined thickness. This back grinding step is performed by using a grinding apparatus 4 shown in FIG. 3A. The grinding apparatus 4 shown in FIG. 3A includes a chuck table 41 as workpiece holding means for holding a workpiece and grinding means 42 for grinding the workpiece held on the chuck table 41. The chuck table 41 has an upper surface as a holding surface for holding the workpiece under suction. The chuck table 41 is rotatable in the direction shown by an arrow 41a in FIG. 3A by a rotational drive mechanism (not shown). The grinding means 42 includes a spindle housing 421, a spindle 422 rotatably supported to the spindle housing 421 and adapted to be rotated by a rotational drive mechanism (not shown), a mounter 423 fixed to the lower end of the spindle 422, and a grinding wheel 424 mounted on the lower surface of the mounter 423. The grinding wheel 424 is composed of an annular base 425 and a plurality of abrasive members 426 fixed to the lower surface of the annular base 425 so as to be annularly arranged along the outer circumference thereof. The annular base 425 is mounted on the lower surface of the mounter 423 by a plurality of fastening bolts 427.

Figure 3A:
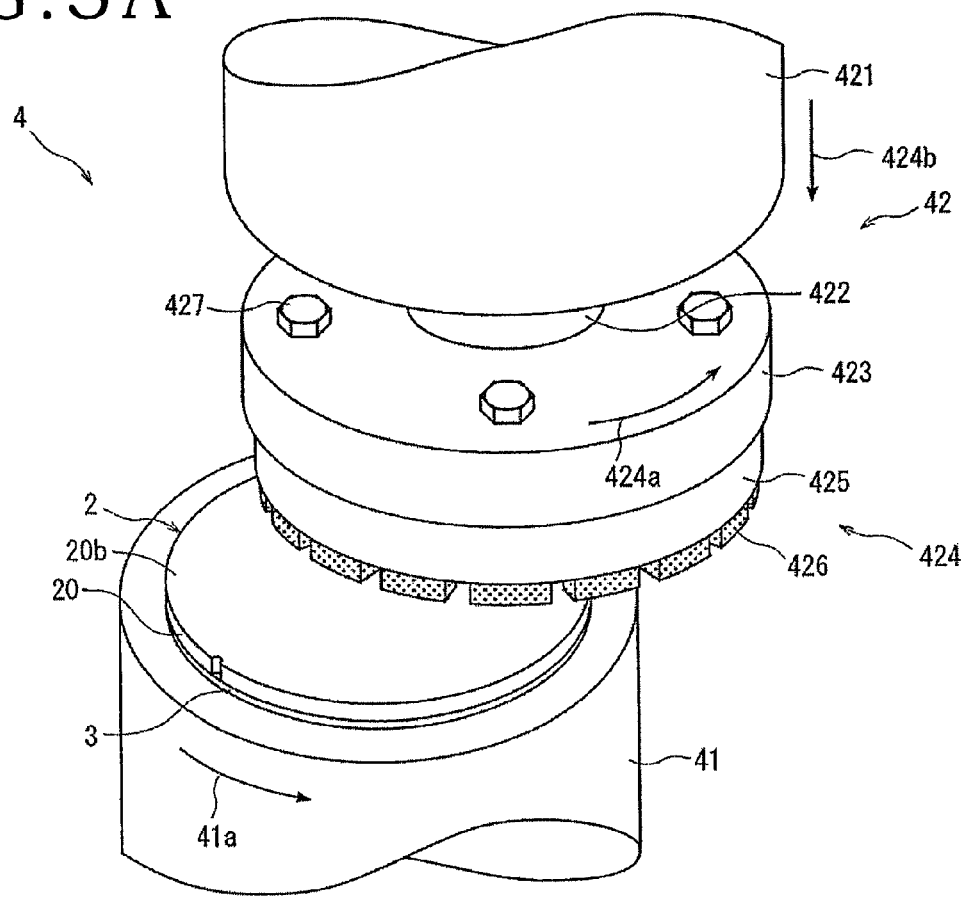
FIGS. 3A and 3B are views for illustrating a back grinding step.
Figure 3B:
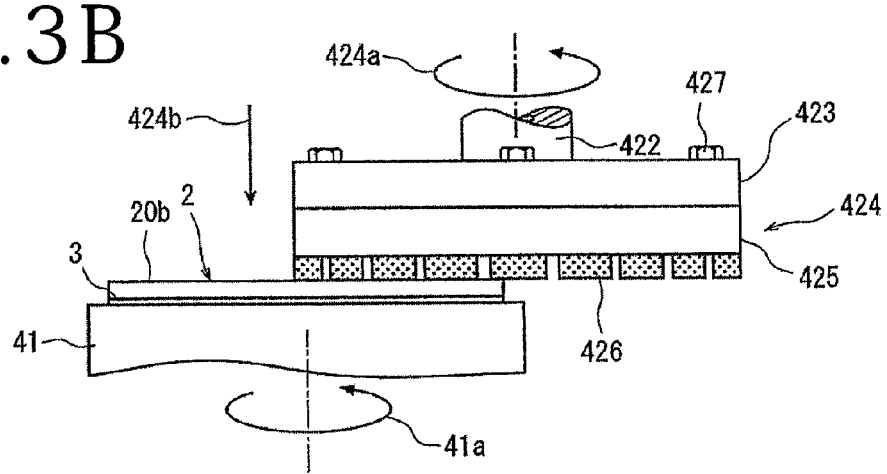

In performing the back grinding step by using the grinding apparatus 4 mentioned above, the semiconductor wafer 2 is placed on the chuck table 41 in the condition where the protective member 3 attached to the semiconductor wafer 2 is in contact with the upper surface (holding surface) of the chuck table 41 as shown in FIG. 3A. Thereafter, suction means (not shown) is operated to hold the semiconductor wafer 2 through the protective member 3 on the chuck table 41 under suction (wafer holding step). Accordingly, the semiconductor wafer 2 is held through the protective member 3 on the chuck table 41 under suction in the condition where the back side 20b of the substrate 20 is oriented upward. After holding the semiconductor wafer 2 through the protective member 3 on the chuck table 41 under suction as mentioned above, the chuck table 41 is rotated in the direction of the arrow 41a in FIG. 3A at 300 rpm, for example. At the same time, the grinding wheel 424 of the grinding means 42 is also rotated in the direction shown by an arrow 424a in FIG. 3A at 6000 rpm, for example. Thereafter, the grinding means 42 is lowered to bring the abrasive members 426 of the grinding wheel 424 into contact with the back side 20b (work surface) of the substrate 20 of the semiconductor wafer 2 as shown in FIG. 3B. Thereafter, the grinding wheel 424 is fed (lowered) in the direction shown by an arrow 424b in FIGS. 3A and 3B (in the direction perpendicular to the holding surface of the chuck table 41) by a predetermined amount at a feed speed of 1 μm/second, for example. As a result, the back side 20b of the substrate 20 of the semiconductor wafer 2 is ground to reduce the thickness of the semiconductor wafer 2 to a predetermined thickness. In this preferred embodiment, the thickness of the substrate 20 is reduced to 100 μm, so that the thickness of the semiconductor wafer 2 is reduced to 110 μm as the sum of the thickness (100 μm) of the substrate 20 and the thickness (10 μm) of the functional layer 21.

Figure 4:
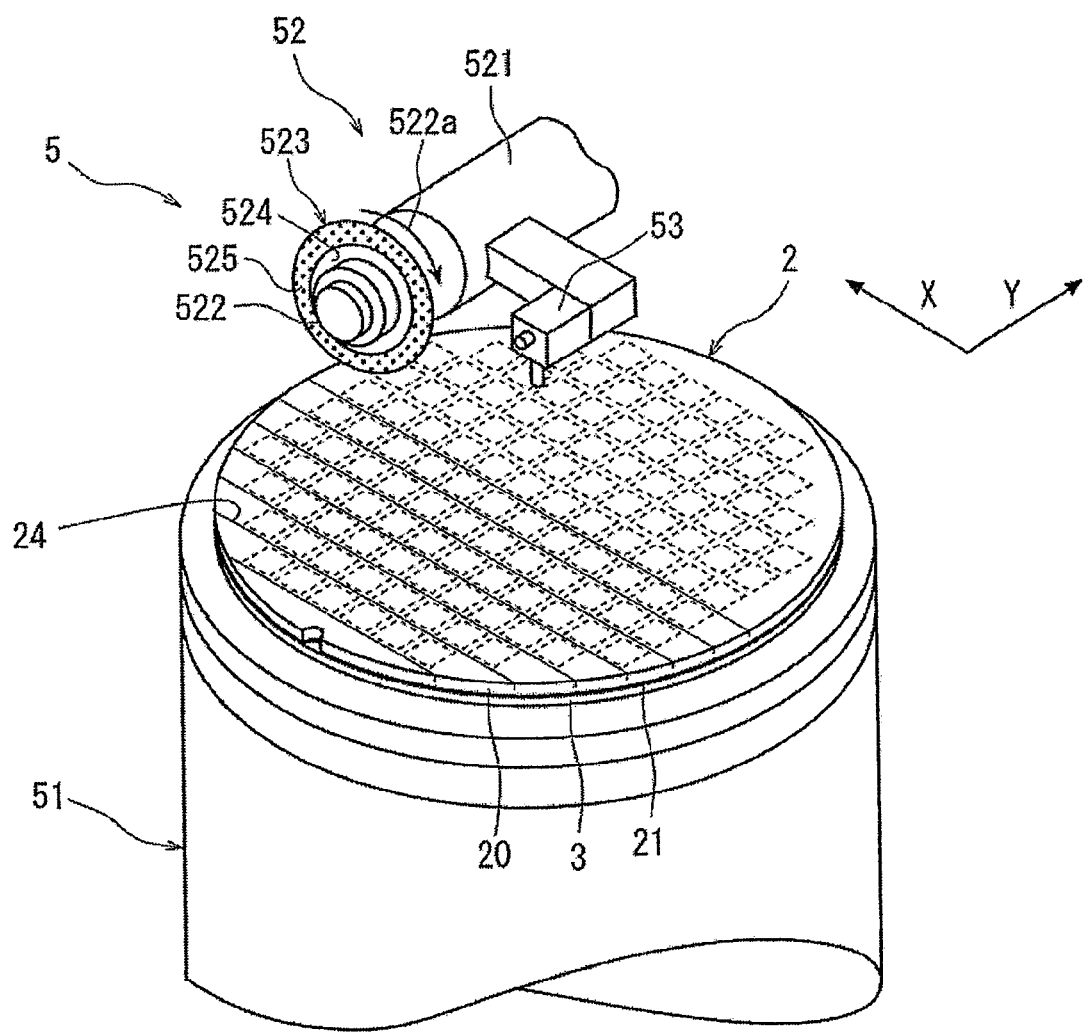
FIG. 4 is a perspective view of an essential part of a cutting apparatus for performing a division groove forming step.

After performing the back grinding step mentioned above, a division groove forming step is performed in such a manner that the back side 20b of the substrate 20 of the semiconductor wafer 2 is cut in an area corresponding to each division line 22 by using a cutting blade to thereby form a division groove having a depth not reaching the functional layer 21 so that a part of the substrate 20 is left in this area. This division groove forming step is performed by using a cutting apparatus 5 shown in FIG. 4. As shown in FIG. 4, the cutting apparatus 5 includes a chuck table 51 as workpiece holding means for holing a workpiece, cutting means 52 for cutting the workpiece held on the chuck table 51, and imaging means 53 for imaging the workpiece held on the chuck table 51. The chuck table 51 has an upper surface as a holding surface for holding the workpiece thereon under suction. The chuck table 51 is movable both in the feeding direction shown by an arrow X in FIG. 4 by feeding means (not shown) and in the indexing direction shown by an arrow Y in FIG. 4 by indexing means (not shown).

The cutting means 52 includes a spindle housing 521 extending in a substantially horizontal direction, a spindle 522 rotatably supported to the spindle housing 521, and a cutting blade 523 mounted on the spindle 522 at a front end portion thereof. The spindle 522 is adapted to be rotated in the direction shown by an arrow 522a by a servo motor (not shown) provided in the spindle housing 521. The cutting blade 523 is composed of a disk-shaped base 524 formed of aluminum and an annular cutting edge 525 mounted on one side surface of the base 524 along the outer circumference thereof. The annular cutting edge 525 is an electroformed diamond blade produced by bonding diamond abrasive grains having a grain size of 3 to 4 μm with nickel plating to the side surface of the outer circumferential portion of the base 524. For example, the cutting edge 525 has a thickness of 30 μm and an outer diameter of 50 mm.

The imaging means 53 is mounted on a front end portion of the spindle housing 521 and includes an ordinary imaging device (CCD) for imaging the workpiece by using visible light, infrared light applying means for applying infrared light to the workpiece, an optical system for capturing the infrared light applied by the infrared light applying means, and an imaging device (infrared CCD) for outputting an electrical signal corresponding to the infrared light captured by the optical system. An image signal output from the imaging means 53 is transmitted to control means (not shown).

In performing the division groove forming step by using the cutting apparatus 5 mentioned above, the semiconductor wafer 2 processed by the back grinding step is placed on the chuck table 51 in the condition where the protective member 3 is in contact with the upper surface of the chuck table 51 as shown in FIG. 4. Thereafter, suction means (not shown) is operated to hold the semiconductor wafer 2 through the protective member 3 on the chuck table 51 under suction (wafer holding step). Accordingly, the back side 20b of the substrate 20 of the semiconductor wafer 2 held on the chuck table 51 is oriented upward. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be cut. More specifically, the imaging means 53 and the control means perform image processing such as pattern matching for making the alignment of the cutting blade 523 and the area corresponding to each division line 22 extending in a first direction on the functional layer 21 of the semiconductor wafer 2, thus performing the alignment of a cut area by the cutting blade 523 (alignment step). Similarly, the alignment of a cut area by the cutting blade 523 is performed for the area corresponding to each division line 22 extending in a second direction perpendicular to the first direction on the functional layer 21. Although the front side 21a of the functional layer 21 where the division lines 22 are formed is oriented downward, the division lines 22 can be imaged through the substrate 20 from the back side 20b thereof because the imaging means 53 includes the infrared light applying means for applying infrared light, the optical system for capturing the infrared light, and the imaging device (infrared CCD) for outputting an electrical signal corresponding to the infrared light as described above.

Figure 5A:
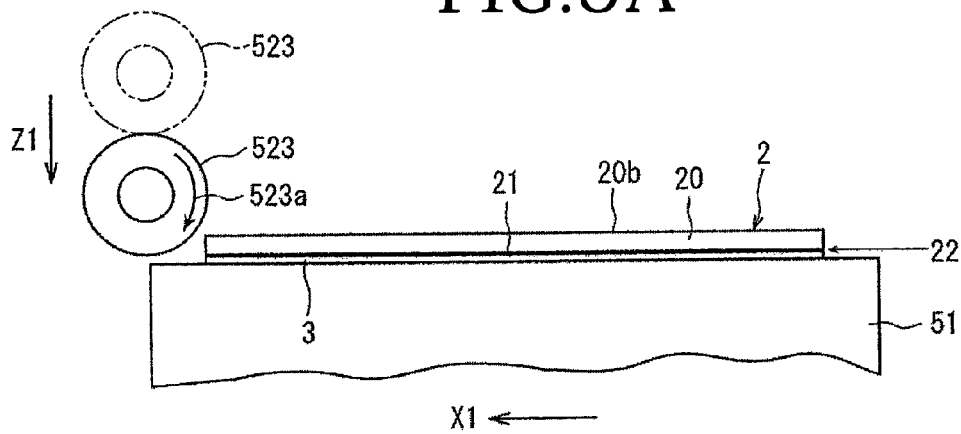
FIGS. 5A to 5D are views for illustrating the division groove forming step.

After performing the alignment step mentioned above to detect the area corresponding to each division line 22 of the semiconductor wafer 2 held on the chuck table 51, the chuck table 51 is moved to a cut start position in the cut area by the cutting blade 523, thereby positioning one end (left end as viewed in FIG. 5A) of the area corresponding to a predetermined one of the division lines 22 extending in the first direction, on the right side of a position directly below the cutting blade 523 by a predetermined amount as shown in FIG. 5A.

Figure 5B:
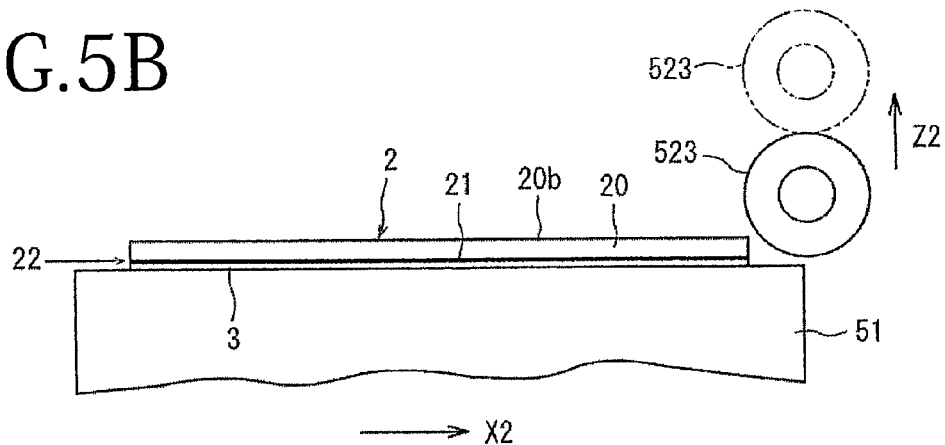
Figure 5C:
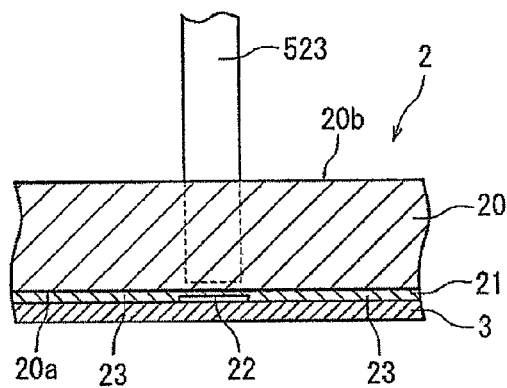

In the condition where the semiconductor wafer 2 held on the chuck table 51 is set at the cut start position in the cut area as described above, the cutting blade 523 is lowered from a standby position shown by a phantom line in FIG. 5A to a working position shown by a solid line in FIG. 5A as shown by an arrow Z1 in FIG. 5A. As shown in FIGS. 5A and 5C, this working position is set so that the lower end of the cutting blade 523 does not reach the functional layer 21 of the semiconductor wafer 2 (e.g., the lower end of the cutting blade 53 is set at a vertical position below the back side 20b of the substrate 20 by an amount of 90 to 95 μm in the case of leaving a part of the substrate 20 by an amount of 10 to 5 μm from the front side 20a of the substrate 20, i.e., from the back side of the functional layer 21).

Figure 5D:
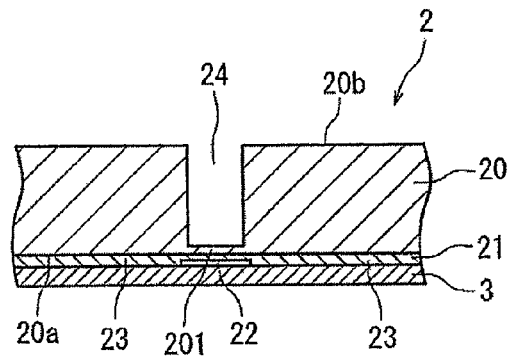

Thereafter, the cutting blade 523 is rotated in the direction shown by an arrow 523a in FIG. 5A at a predetermined rotational speed, and the chuck table 51 is moved in the direction shown by an arrow X1 in FIG. 5A at a predetermined feed speed. When the other end (right end as viewed in FIG. 5B) of the area corresponding to the predetermined division line 22 reaches a position on the left side of the position directly below the cutting blade 523 by a predetermined amount as shown in FIG. 5B, the movement of the chuck table 51 is stopped. As a result, a division groove 24 is formed on the back side 20b of the substrate 20 of the semiconductor wafer 2 along the predetermined division line 22 in the condition where the depth of the division groove 24 does not reach the functional layer 21, that is, a part 201 is left on the front side 20a of the substrate 20 as shown in FIG. 5D. In other words, the part 201 of the substrate 20 is left between the bottom of the division groove 24 and the functional layer 21 (division groove forming step).

Thereafter, the cutting blade 523 is raised from the working position to the standby position as shown by an arrow Z2 in FIG. 5B, and the chuck table 51 is next moved in the direction shown by an arrow X2 in FIG. 5B to the position shown in FIG. 5A. Thereafter, the chuck table 51 is moved in the direction (indexing direction) perpendicular to the sheet plane of FIG. 5A by an amount corresponding to the pitch of the division lines 22, thereby aligning the cutting blade 523 with the area corresponding to the next division line 22 extending in the first direction. In the condition where the cutting blade 523 is aligned with the area corresponding to the next division line 22 extending in the first direction as mentioned above, the division groove forming step is performed similarly.

For example, the division groove forming step is performed under the following processing conditions.

Cutting blade: outer diameter: 50 mm,
thickness: 30 μm
Rotational speed of the cutting blade: 20000 rpm
Work feed speed: 50 mm/second After performing the division groove forming step for the areas corresponding to all the division lines 22 extending in the first direction on the semiconductor wafer 2, the chuck table 51 is rotated 90 degrees to similarly perform the division groove forming step for the areas corresponding to all the other division lines 22 extending in the second direction perpendicular to the first direction.

After performing the division groove forming step mentioned above, a wafer dividing step is performed in such a manner that a laser beam having an absorption wavelength to the substrate 20 and the functional layer 21 is applied to the semiconductor wafer 2 from the back side 20b of the substrate 20 along the bottom of each division groove 24, thereby cutting the part 201 of the substrate 20 and the functional layer 21 along each division line 22. This wafer dividing step is performed by using a laser processing apparatus 6 shown in FIG. 6. The laser processing apparatus 6 shown in FIG. 6 includes a chuck table 61 as workpiece holding means for holding a workpiece, laser beam applying means 62 for applying a laser beam to the workpiece held on the chuck table 61, and imaging means 63 for imaging the workpiece held on the chuck table 61. The chuck table 61 has an upper surface as a holding surface for holding the workpiece thereon under suction. The chuck table 61 is movable both in the feeding direction shown by an arrow X in FIG. 6 by feeding means (not shown) and in the indexing direction shown by an arrow Y in FIG. 6 by indexing means (not shown).

The laser beam applying means 62 includes a cylindrical casing 621 extending in a substantially horizontal direction. The laser beam applying means 62 further includes focusing means 622 mounted on the front end of the casing 621 for focusing a pulsed laser beam oscillated by pulsed laser beam oscillating means (not shown) and applying the pulsed laser beam to the workpiece. The imaging means 63 is mounted on a front end portion of the casing 621 constituting the laser beam applying means 62 and includes illuminating means for illuminating the workpiece, an optical system for capturing an area illuminated by the illuminating means, and an imaging device (CCD) for imaging the area captured by the optical system. An image signal output from the imaging means 63 is transmitted to control means (not shown).

Figure 6:
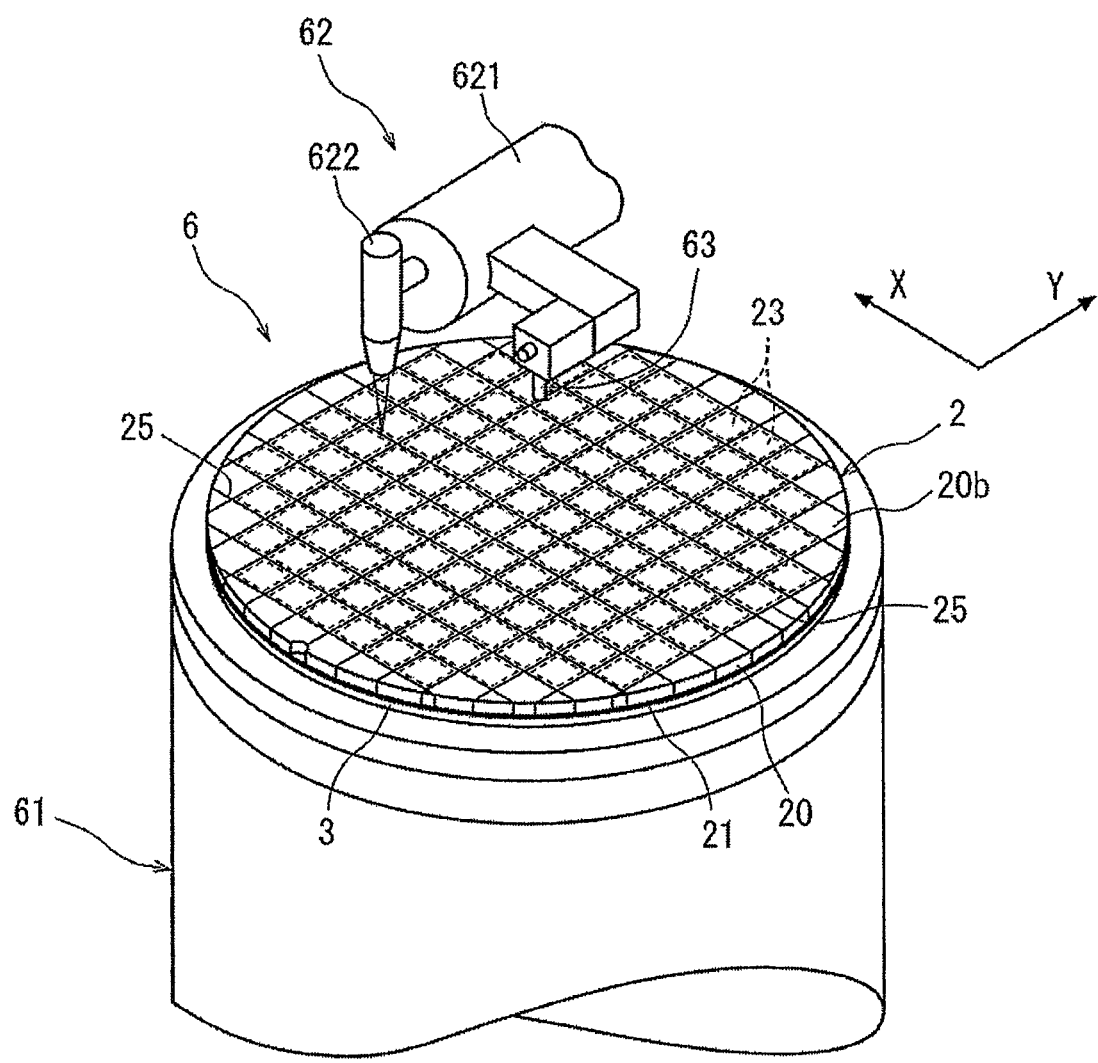
FIG. 6 is a perspective view of an essential part of a laser processing apparatus for performing a wafer dividing step.

The wafer dividing step using the laser processing apparatus 6 mentioned above will now be described with reference to FIG. 6 and FIGS. 7A to 7D. The semiconductor wafer 2 processed by the division groove forming step is first placed on the chuck table 61 of the laser processing apparatus 6 shown in FIG. 6 in the condition where the protective member 3 attached to the front side 21a of the functional layer 21 formed on the front side 20a of the substrate 20 of the semiconductor wafer 2 is in contact with the upper surface of the chuck table 61 as shown in FIG. 6. Thereafter, suction means (not shown) is operated to hold the semiconductor wafer 2 through the protective member 3 on the chuck table 61 under suction (wafer holding step). Accordingly, the back side 20b of the substrate 20 of the semiconductor wafer 2 held on the chuck table 61 is oriented upward. Thereafter, the chuck table 61 holding the semiconductor wafer 2 is moved to a position directly below the imaging means 63 by operating the feeding means (not shown).

In the condition where the chuck table 61 is positioned directly below the imaging means 63, an alignment operation is performed by the imaging means 63 and the control means (not shown) to detect a subject area of the semiconductor wafer 2 to be laser-processed. More specifically, the imaging means 63 and the control means perform image processing such as pattern matching for making the alignment of the division grooves 24 extending in the first direction and the focusing means 622 of the laser beam applying means 62 for applying the laser beam to the semiconductor wafer 2 along the division grooves 24 from the back side 20b of the substrate 20, thus performing the alignment of a laser beam applying position (alignment step). Similarly, the alignment of a laser beam applying position is performed for the other division grooves 24 extending in the second direction perpendicular to the first direction on the semiconductor wafer 2.

Figure 7A:
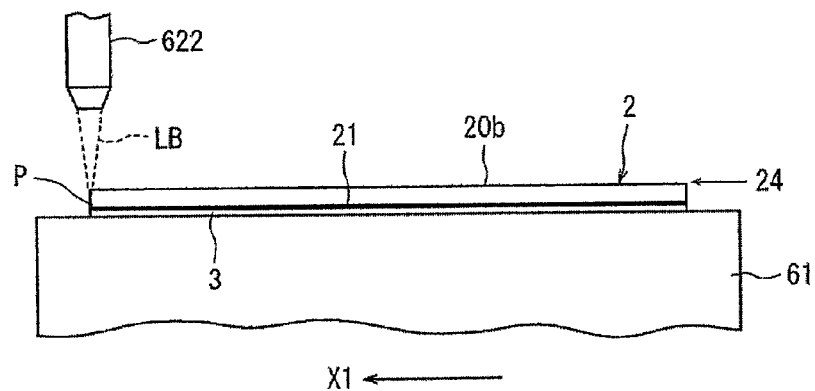
FIGS. 7A to 7D are views for illustrating the wafer dividing step.

After performing the alignment step mentioned above, the chuck table 61 is moved to a laser beam applying area where the focusing means 622 of the laser beam applying means 62 is located as shown in FIG. 7A, thereby positioning a predetermined one of the division grooves 24 extending in the first direction directly below the focusing means 622. At this time, one end (left end as viewed in FIG. 7A) of the predetermined division groove 24 is positioned directly below the focusing means 622 as shown in FIG. 7A. Further, the focal point P of a pulsed laser beam LB to be applied from the focusing means 622 is set near the bottom surface of the predetermined division groove 24 as shown in FIG. 7C. Thereafter, the pulsed laser beam LB having an absorption wavelength to the substrate 20 and the functional layer 21 is applied from the focusing means 622 to the semiconductor wafer 2, and the chuck table 61 is moved in the direction shown by an arrow X1 in FIG. 7A at a predetermined feed speed. When the other end (right end as viewed in FIG. 7B) of the predetermined division groove 24 reaches the position directly below the focusing means 622 as shown in FIG. 7B, the application of the pulsed laser beam LB is stopped and the movement of the chuck table 61 is also stopped (wafer dividing step).

Figure 7B:
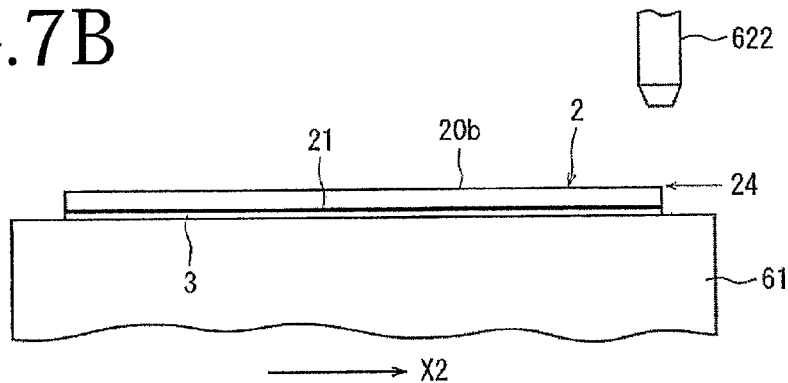
Figure 7C:
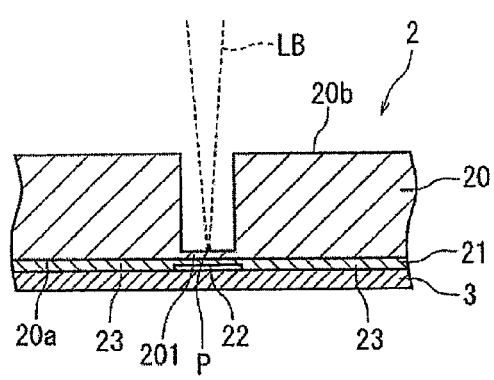
Figure 7D:
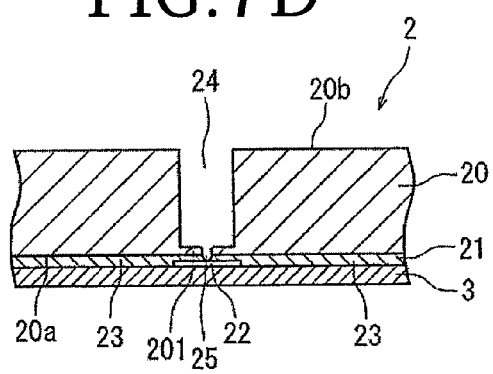

By performing the wafer dividing step mentioned above, a laser processed groove 25 is formed through the part 201 of the substrate 20 and the functional layer 21 of the semiconductor wafer 2 so as to extend along the predetermined division groove 24 as shown in FIG. 7D. As a result, the part 201 of the substrate 20 and the functional layer 21 are cut by the laser processed groove 25 having a depth reaching the protective member 3.

Thereafter, the chuck table 61 is moved in the direction (indexing direction) perpendicular to the sheet plane of FIG. 7B by the pitch of the division grooves 24 (equivalent to the pitch of the division lines 22). Thereafter, the pulsed laser beam LB is applied from the focusing means 622 to the semiconductor wafer 2, and the chuck table 61 is moved in the direction shown by an arrow X2 in FIG. 7B at the predetermined feed speed, thereby applying the pulsed laser beam LB along the next division groove 24 extending in the first direction. When the left end of the next division groove 24 as viewed in FIG. 7B reaches the position directly below the focusing means 622, the application of the pulsed laser beam LB is stopped and the movement of the chuck table 61 is also stopped. By performing the wafer dividing step mentioned above, a similar laser processed groove 25 is formed through the part 201 of the substrate 20 and the functional layer 21 of the semiconductor wafer 2 so as to extend along the next division groove 24 as shown in FIG. 7D. As a result, the part 201 of the substrate 20 and the functional layer 21 are cut by this laser processed groove 25.

For example, the wafer dividing step mentioned above is performed under the following processing conditions.

Light source: YAG pulsed laser
Wavelength: 355 nm
Repetition frequency: 20 kHz
Average power: 2 W
Focused spot diameter: 8 μm
Numerical aperture (NA) of the focusing lens: 0.05
Work feed speed: 100 mm/second After performing the wafer dividing step along all of the division grooves 24 extending in the first direction, the chuck table 61 is rotated 90 degrees to similarly perform the wafer dividing step along all of the other division grooves 24 extending in the second direction perpendicular to the first direction. As a result, the laser processed groove 25 having a depth reaching the protective member 3 is formed through the part 201 of the substrate 20 and the functional layer 21 along each division line 22, thereby dividing the semiconductor wafer 2 into individual device chips corresponding to the plural image sensors 23.

In the wafer dividing step mentioned above, the semiconductor wafer 2 processed by the division groove forming step is held on the chuck table 61 of the laser processing apparatus 6 in the condition where the protective member 3 attached to the semiconductor wafer 2 is in contact with the upper surface (holding surface) of the chuck table 61, i.e., in the condition where the back side 20b of the substrate 20 of the semiconductor wafer 2 is oriented upward. In this condition, the laser beam having an absorption wavelength to the substrate 20 and the functional layer 21 is applied to the semiconductor wafer 2 from the back side 20b of the substrate 20 along the bottom of each division groove 24 to thereby form the laser processed groove 25 reaching the protective member 3 along each division line 22. Accordingly, even when relatively large debris scatters, there is no possibility that the debris may fall on the image sensors 23 formed on the front side of the semiconductor wafer 2, so that it is possible to solve the problem that the delicate pixels constituting each image sensor 23 may be damaged to cause a reduction in quality of each image sensor.

Further, in the wafer dividing step mentioned above, the semiconductor wafer 2 is divided by forming the laser processed groove 25 through the part 201 of the substrate 20 and the functional layer 21 along each division groove 24 formed in the division groove forming step. Accordingly, the thickness of a portion to be cut by the laser beam is small, i.e., 15 to 20 μm (the sum of the thickness (10 μm) of the functional layer 21 and the thickness (5 to 10 μm) of the part 201 of the substrate 20), so that the semiconductor wafer 2 can be completely cut by applying the laser beam.

Further, unlike the prior art, it is unnecessary to form two laser processed grooves along each division line 22 and position the cutting blade 523 within the spacing between the two laser processed groove, so as to form each division groove 24. Accordingly, the width of each division line 22 can be reduced in this preferred embodiment, so that it is possible to increase the number of image sensors that can be formed per wafer, thereby improving the productivity.

Figure 8A:
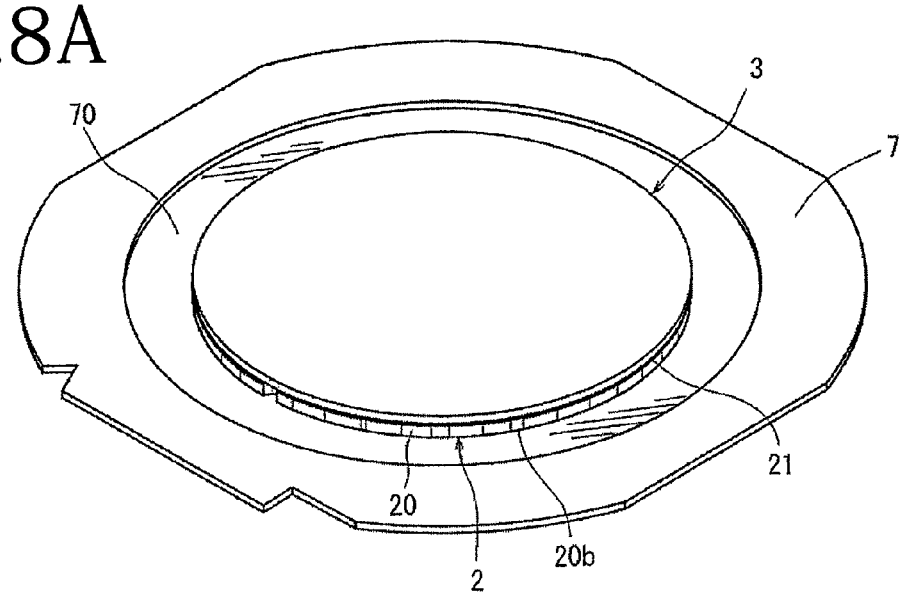
FIGS. 8A and 8B are perspective views for illustrating a wafer supporting step.
Figure 8B:
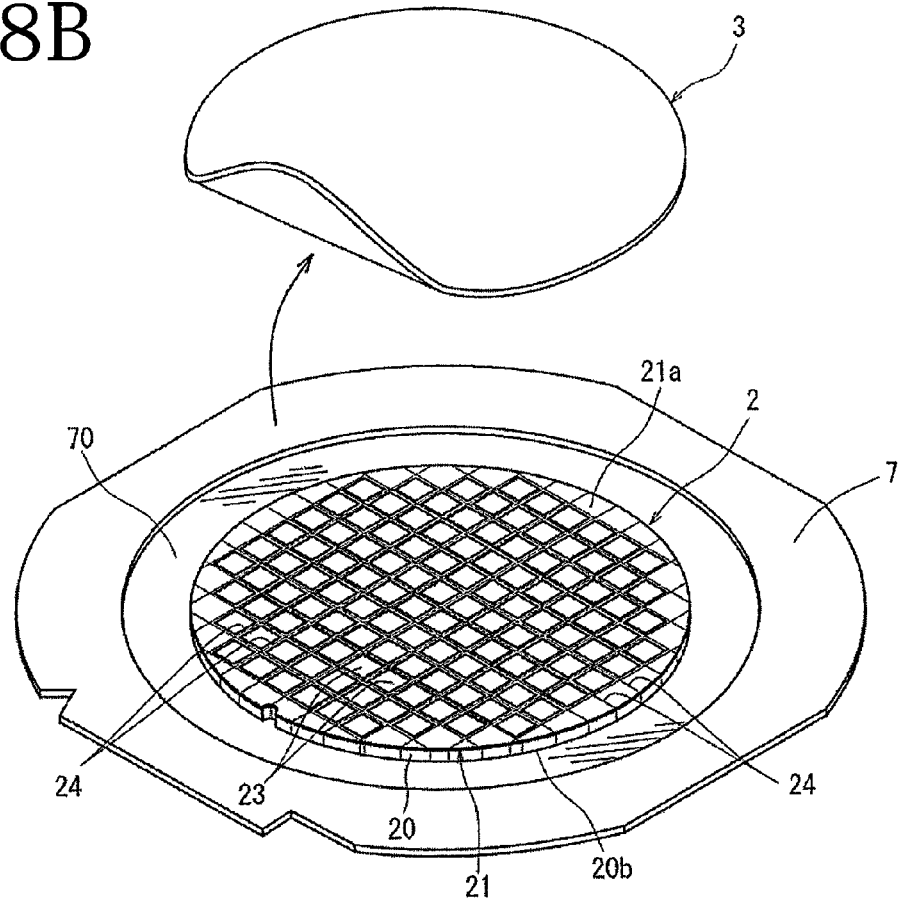

After performing the wafer dividing step mentioned above, a wafer supporting step is performed in such a manner that the back side 20b of the substrate 20 of the semiconductor wafer 2 is attached to an adhesive tape supported at its peripheral portion to an annular frame having an inside opening capable of receiving the semiconductor wafer 2, and the protective member 3 is next peeled from the front side of the semiconductor wafer 2. More specifically, as shown in FIG. 8A, an adhesive tape 70 is preliminarily supported at its peripheral portion to an annular frame 7 having an inside opening, so that the inside opening of the annular frame 7 is closed by the adhesive tape 70. In this condition, the back side 20b of the substrate 20 of the semiconductor wafer 2 is attached to the front side (adhesive side) of the adhesive tape 70 exposed to the inside opening of the annular frame 7. Further, as shown in FIG. 8B, the protective member 3 is next peeled from the front side 21a of the functional layer 21 of the semiconductor wafer 2. Accordingly, the front side 21a of the functional layer 21 of the semiconductor wafer 2 is oriented upward as shown in FIG. 8B in the condition where the semiconductor wafer 2 is attached to the adhesive tape 70. For example, the adhesive tape 70 is composed of a polyethylene film having a thickness of 100 μm and an adhesive layer formed on the front side of the polyethylene film. While the back side 20b of the substrate 20 of the semiconductor wafer 2 is attached to the adhesive tape 70 preliminarily supported at its peripheral portion to the annular frame 7 in this preferred embodiment shown in FIGS. 8A and 8B, the adhesive tape 70 may be attached to the back side 20b of the substrate 20 of the semiconductor wafer 2 and at the same time the peripheral portion of the adhesive tape 70 may be mounted to the annular frame 7.

Figure 9:
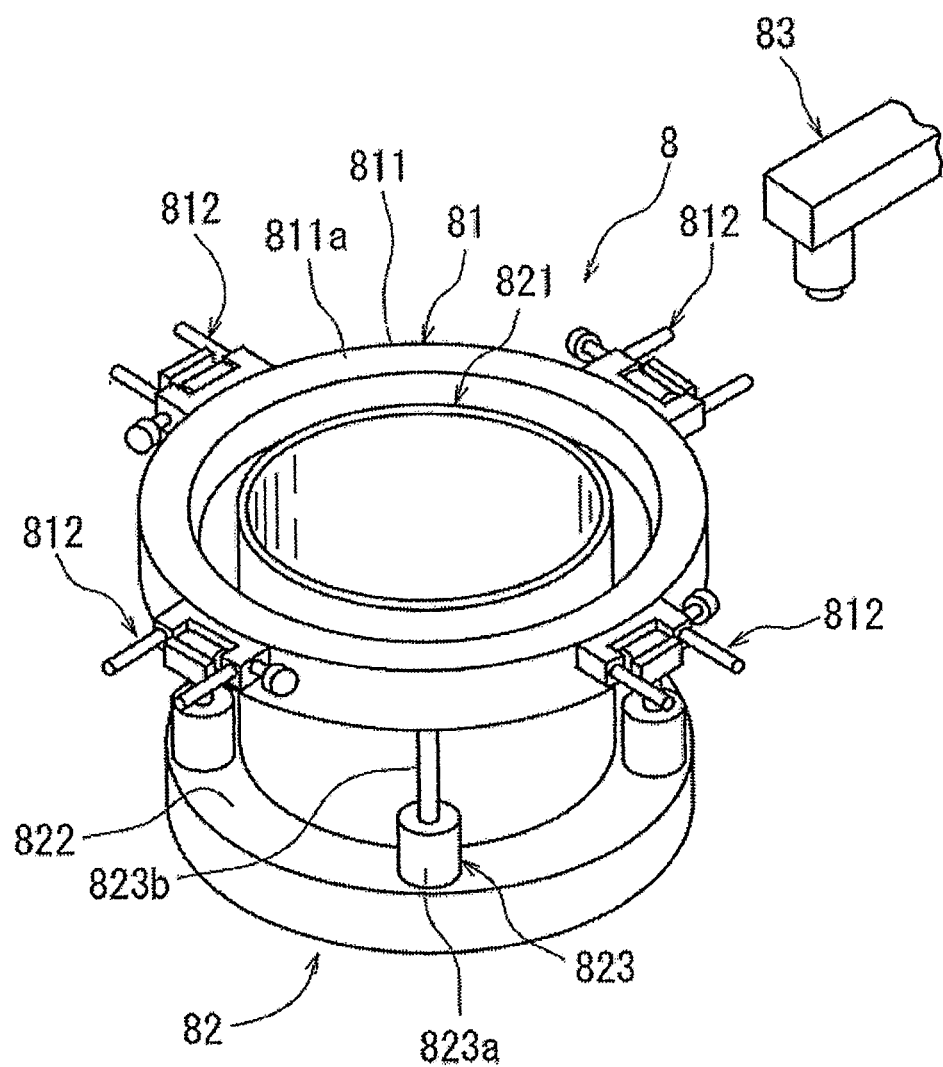
FIG. 9 is a perspective view of a pickup apparatus for performing a pickup step.

After performing the wafer supporting step mentioned above, a pickup step is performed to pick up the individual device chips having the image sensors 23 divided from the semiconductor wafer 2 attached to the adhesive tape 70. This pickup step is performed by using a pickup apparatus 8 shown in FIG. 9. The pickup apparatus 8 shown in FIG. 9 includes frame holding means 81 for holding the annular frame 7, tape expanding means 82 for expanding the adhesive tape 70 supported to the annular frame 7 held by the frame holding means 81, and a pickup collet 83. The frame holding means 81 includes an annular frame holding member 811 and a plurality of clamps 812 as fixing means provided on the outer circumference of the frame holding member 811. The upper surface of the frame holding member 811 functions as a mounting surface 811a for mounting the annular frame 7 thereon. The annular frame 7 mounted on the mounting surface 811a is fixed to the frame holding member 811 by the clamps 812. The frame holding means 81 is supported by the tape expanding means 82 so as to be vertically movable.

Figure 10A:
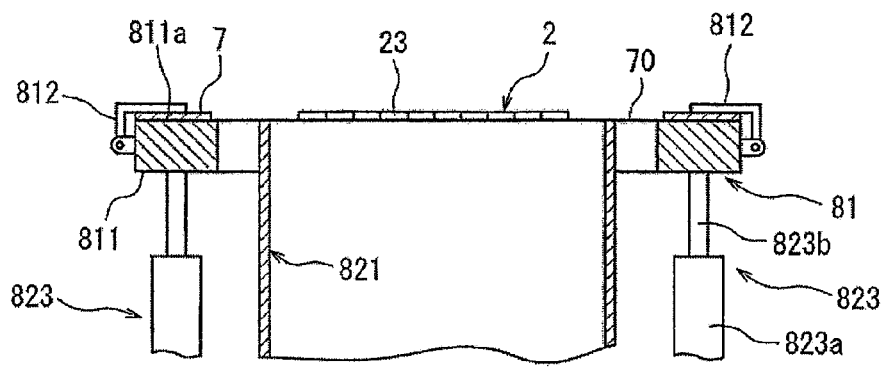
FIGS. 10A to 10C are sectional views for illustrating the pickup step.
Figure 10B:
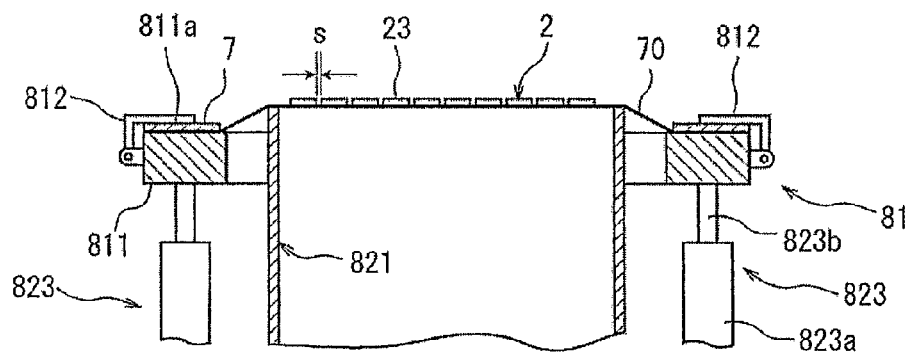

The tape expanding means 82 includes an expanding drum 821 provided inside of the annular frame holding member 811. The expanding drum 821 has an outer diameter smaller than the inner diameter of the annular frame 7 and an inner diameter larger than the outer diameter of the semiconductor wafer 2 attached to the adhesive tape 70 supported to the annular frame 7. The expanding drum 821 has a supporting flange 822 at the lower end of the expanding drum 821. The tape expanding means 82 further includes supporting means 823 for vertically movably supporting the annular frame holding member 811. The supporting means 823 is composed of a plurality of air cylinders 823a provided on the supporting flange 822. Each air cylinder 823a is provided with a piston rod 823b connected to the lower end of the annular frame holding member 811. The supporting means 823 composed of these plural air cylinders 823a functions to vertically move the annular frame holding member 811 so as to selectively take a reference position where the mounting surface 811a is substantially equal in height to the upper end of the expanding drum 821 as shown in FIG. 10A and an expansion position where the mounting surface 811a is lower in height than the upper end of the expanding drum 821 by a predetermined amount as shown in FIG. 10B.

The pickup step using the pickup apparatus 8 will now be described with reference to FIGS. 10A to 10C. As shown in FIG. 10A, the annular frame 7 supporting the semiconductor wafer 2 through the adhesive tape 70 is mounted on the mounting surface 811a of the frame holding member 811 of the frame holding means 81 and fixed to the frame holding member 811 by the clamps 812 (frame holding step). At this time, the frame holding member 811 is set at the reference position shown in FIG. 10A. Thereafter, the air cylinders 823a as the supporting means 823 of the tape expanding means 82 are operated to lower the annular frame holding member 811 to the expansion position shown in FIG. 10B. Accordingly, the annular frame 7 fixed to the mounting surface 811a of the frame holding member 811 is also lowered, so that the adhesive tape 70 supported to the annular frame 7 comes into abutment against the upper end of the expanding drum 821 and is expanded as shown in FIG. 10B (tape expanding step). As a result, a tensile force acts on the semiconductor wafer 2 attached to the adhesive tape 70 in the radial direction of the semiconductor wafer 2. Accordingly, an increased spacing S is formed between any adjacent ones of the individual image sensors 23 already separated from each other as shown in FIG. 10B.

Figure 10C:
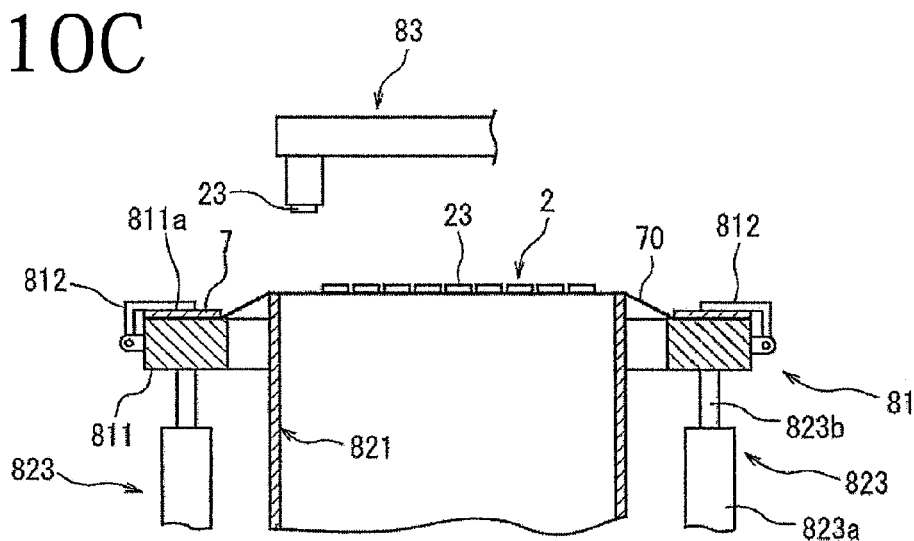

Thereafter, the pickup collet 83 is operated to hold each image sensor 23 under suction and peel it from the adhesive tape 70, thus individually picking up the image sensors 23 as shown in FIG. 10C (pickup step). Thereafter, each image sensor 23 as a device chip thus picked up is transferred to a tray (not shown) or a position where a die bonding step is performed. By performing the tape expanding step, the increased spacing S is formed between any adjacent ones of the individual image sensors 23 attached to the adhesive tape 70, so that each image sensor 23 can be easily picked up without the contact with its adjacent image sensor 23 in the pickup step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer along a plurality of division lines formed on a front side of said wafer, said wafer being composed of a substrate and a functional layer formed on a front side of said substrate, said functional layer being partitioned by said division lines to define a plurality of separate regions where a plurality of image sensors are individually formed, said wafer processing method comprising:
   a protective member attaching step of attaching a protective member to the front side of said wafer;
   a division groove forming step of cutting a back side of said substrate of said wafer in an area corresponding to each division line by using a cutting blade after performing said protective member attaching step, thereby forming a division groove having a depth not reaching said functional layer so that a part of said substrate is left in said area; and
   a wafer dividing step of applying a laser beam to said wafer from the back side of said substrate along a bottom of said division groove extending along each division line after performing said division groove forming step, thereby cutting said part of said substrate and said functional layer along each division line.

2. The wafer processing method according to claim 1, further comprising a back grinding step of grinding the back side of said substrate of said wafer to thereby reduce the thickness of said wafer to a predetermined thickness after performing said protective member attaching step and before performing said division groove forming step.

3. The wafer processing method according to claim 1, further comprising a wafer supporting step of attaching the back side of said wafer to an adhesive tape supported at its peripheral portion to an annular frame having an inside opening capable of receiving said wafer and next peeling said protective member from the front side of said wafer, after performing said wafer dividing step.

* * * * *